United States Patent
Ryu et al.

(10) Patent No.: US 12,010,883 B2
(45) Date of Patent: Jun. 11, 2024

(54) DISPLAY DEVICE HAVING FILLER AND SEAL, AND METHOD FOR MANUFACTURING THE SAME

(71) Applicant: Samsung Display Co., Ltd., Yongin-si (KR)

(72) Inventors: Seung-Soo Ryu, Hwaseong-si (KR); Sang Hyuck Yoon, Seoul (KR); Byoungyong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 16/932,831

(22) Filed: Jul. 20, 2020

(65) Prior Publication Data

US 2021/0066435 A1 Mar. 4, 2021

(30) Foreign Application Priority Data

Aug. 30, 2019 (KR) .................. 10-2019-0107455

(51) Int. Cl.
*H10K 59/131* (2023.01)
*H10K 50/842* (2023.01)
*H10K 59/12* (2023.01)
*H10K 71/00* (2023.01)

(52) U.S. Cl.
CPC ....... *H10K 59/131* (2023.02); *H10K 50/8426* (2023.02); *H10K 71/00* (2023.02); *H10K 59/1201* (2023.02)

(58) Field of Classification Search
CPC . H01L 27/3276; H01L 51/5246; H01L 51/56; H01L 2227/323; H10K 59/131; H10K 59/1201; H10K 71/00; H10K 50/8426

USPC ..................................... 257/40, 59
See application file for complete search history.

(56) References Cited

U.S. PATENT DOCUMENTS

| 8,994,042 B2 | 3/2015 | Kang et al. |
| 9,123,593 B2 | 9/2015 | Kang et al. |
| 2005/0217720 A1* | 10/2005 | Rey-Mermet ............ H01G 9/20 156/263 |

(Continued)

FOREIGN PATENT DOCUMENTS

| EP | 2806307 | 11/2014 |
| JP | 2011018479 | 1/2011 |

(Continued)

OTHER PUBLICATIONS

Extended European Search Report dated Feb. 16, 2021, issued in European Patent Application No. 20193022.9.

*Primary Examiner* — Eric W Jones
(74) *Attorney, Agent, or Firm* — H.C. Park & Associates, PLC

(57) ABSTRACT

A display device includes: a first layer including a pixel array disposed on a base substrate, a side terminal disposed on the base substrate, and a transfer wiring electrically connected to the side terminal and the pixel array; a second layer coupled with the first layer; a seal disposed between the first layer and the second layer and surrounding the pixel array; a filler, spaced apart from the seal, overlapping at least a portion of the side terminal and filling a space between the first layer and the second layer; and a conductive connection pad disposed on a side surface of the first layer and contacting the side terminal.

15 Claims, 15 Drawing Sheets

(56) References Cited

U.S. PATENT DOCUMENTS

| | | |
|---|---|---|
| 2007/0146255 A1 | 6/2007 | Lee |
| 2007/0170845 A1* | 7/2007 | Choi .................. H01L 51/5246 |
| | | 313/504 |
| 2012/0287026 A1 | 11/2012 | Masuda |
| 2014/0065430 A1* | 3/2014 | Yamazaki ........... H01L 51/5246 |
| | | 445/25 |
| 2014/0339574 A1* | 11/2014 | Kang .................. G02F 1/13452 |
| | | 257/88 |
| 2015/0062524 A1* | 3/2015 | Kim ..................... G02F 1/1339 |
| | | 156/275.3 |
| 2016/0377905 A1* | 12/2016 | Choi ........................ H01L 24/32 |
| | | 257/72 |
| 2017/0082888 A1* | 3/2017 | Park .................... G02F 1/13458 |
| 2018/0067353 A1* | 3/2018 | Son ........................ H01L 24/05 |
| 2019/0094633 A1 | 3/2019 | Song et al. |
| 2019/0204638 A1 | 7/2019 | Park et al. |
| 2020/0235332 A1 | 7/2020 | Kobayashi et al. |
| 2020/0303482 A1* | 9/2020 | Kishimoto .............. H01L 51/56 |

FOREIGN PATENT DOCUMENTS

| | | |
|---|---|---|
| JP | 6463876 | 2/2019 |
| KR | 10-2014-0136238 | 11/2014 |
| KR | 10-2015-0011731 | 2/2015 |
| KR | 10-1715896 | 3/2017 |
| KR | 10-2018-0078836 | 7/2018 |

\* cited by examiner

DISPLAY DEVICE HAVING FILLER AND SEAL, AND METHOD FOR MANUFACTURING THE SAME

CROSS-REFERENCE TO RELATED APPLICATION

This application claims priority to and the benefit of Korean Patent Application No. 10-2019-0107455 filed on Aug. 30, 2019 which is hereby incorporated by reference for all purposes as if fully set forth herein.

BACKGROUND

Field

Exemplary implementations of the invention relate generally to a display device and, more particularly, to a display device having a conductive connection pad, and a method for manufacturing the same.

Discussion of the Background

A display device includes a display panel and a driver providing driving signals to the display panel. The driver may be included in a driving chip. The driving chip may be combined directly with a substrate of the display panel, or may be connected to a pad through a flexible printed circuit board or the like.

According to a conventional method, the driving chip or the flexible printed circuit board, on which the driving chip is mounted, is bonded to an upper surface of a substrate of the display panel. The area for bonding the driver to the display panel may increase the size of the bezel area.

The above information disclosed in this Background section is only for understanding of the background of the inventive concepts, and, therefore, it may contain information that does not constitute prior art.

SUMMARY

Display devices constructed according to the principles and exemplary implementations of the invention, and methods of manufacturing the same, have a reduced bezel area and improved reliability.

For example, a driver may be bonded to a side surface of a display panel thereby reducing a size of a peripheral area (bezel) of the display panel. A filling member for protecting a side terminal may be formed of an inorganic material. Thus, outgas may be prevented by replacing an organic filling member with an inorganic filling member during the conductive connection pad forming process. Further, in an exemplary embodiment, the filling member may be formed in the same process with a sealing member. Thus, manufacturing efficiency and reliability may be improved.

Additional features of the inventive concepts will be set forth in the description which follows, and in part will be apparent from the description, or may be learned by practice of the inventive concepts.

According to one aspect of the invention, a display device includes: a first layer including a pixel array disposed on a base substrate, a side terminal disposed on the base substrate, and a transfer wiring electrically connected to the side terminal and the pixel array; a second layer coupled with the first layer; a seal disposed between the first layer and the second layer and surrounding the pixel array; a filler, spaced apart from the seal, overlapping at least a portion of the side terminal and filling a space between the first layer and the second layer; and a conductive connection pad disposed on a side surface of the first layer and contacting the side terminal.

The filler may include a filling member including glass.

The filler may include substantially the same material as the seal.

The filler may include a filling member having a first width, and the seal may include a sealing member having a second width smaller than the first width.

The first width may be from about 100 μm to about 300 μm, and the second width may be from about 300 μm to about 1,000 μm.

The filler may include a first filling member and a second filling member disposed between the first filling member and the seal.

The seal may include a different material from that of the filler.

The side terminal may include a plurality of conductive layers.

The transfer wiring may be spaced apart from the conductive connection pad.

A driving device may be bonded to the conductive connection pad, the driving device may be configured to generate a driving signal or a power to the transfer wiring through the conductive connection pad and the side terminal.

The driving device may include a flexible printed circuit board on which a driving chip may be mounted.

The first layer may include an array substrate having an insulation layer including an inorganic material overlapping the side terminal and contacting the filler; and the second layer may include a cover substrate.

According to another aspect of the invention, a display device includes: a first layer including a pixel array disposed on a base substrate, a side terminal disposed on the base substrate, a transfer wiring electrically connected to the side terminal and the pixel array, and an inorganic insulation layer covering the side terminal; a second layer coupled to the first layer; a seal disposed between the first layer and the second layer and surrounding the pixel array; a filler including an inorganic material spaced apart from the seal and filling a space between the inorganic insulation layer and the second layer; and a conductive connection pad disposed on a side surface of the first layer and contacting the side terminal and the filler.

The width of the filler may be from about 100 μm to about 300 μm, and the width of the seal may be from about 300 μm to about 1,000 μm.

A method of manufacturing a display device includes the steps of: preparing a first layer including a pixel array disposed on a base substrate, a transfer wiring electrically connected to the pixel array and a conductive pattern and/or electrically connected to the transfer wiring; forming a seal and a filler, the seal disposed between the first layer and a second layer, the filler, being spaced apart from the seal, overlapping at least a portion of the conductive pattern and/or, and filling a space between the first layer and the second layer; removing a portion of the first layer to dispose a side terminal from the conductive pattern and/or the side terminal being exposed through a side surface of the first layer; and forming a conductive connection pad on the side surface of the first layer, the conductive connection pad contacting the side terminal.

The step of forming the seal and the filler may include: forming a sealing frit and a filling frit on a surface of the first layer or the second layer; disposing the first layer to contact the second layer; and sintering the sealing frit and the filling frit.

The sealing frit and the filling frit may include glass frit.

The first layer may include an array substrate, the second layer may include a cover substrate, the filler may include a filling member, and the seal may include a sealing member, and the step of removing the portion of the first layer may include scribing the cover substrate, the array substrate and the filling member; and grinding or polishing an exposed side surface of the cover substrate, the array substrate and the filling member.

The step of forming the conductive connection pad may include forming a metal layer contacting a side surface of the side terminal; and patterning the metal layer.

A driving device may be coupled to the conductive connection pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
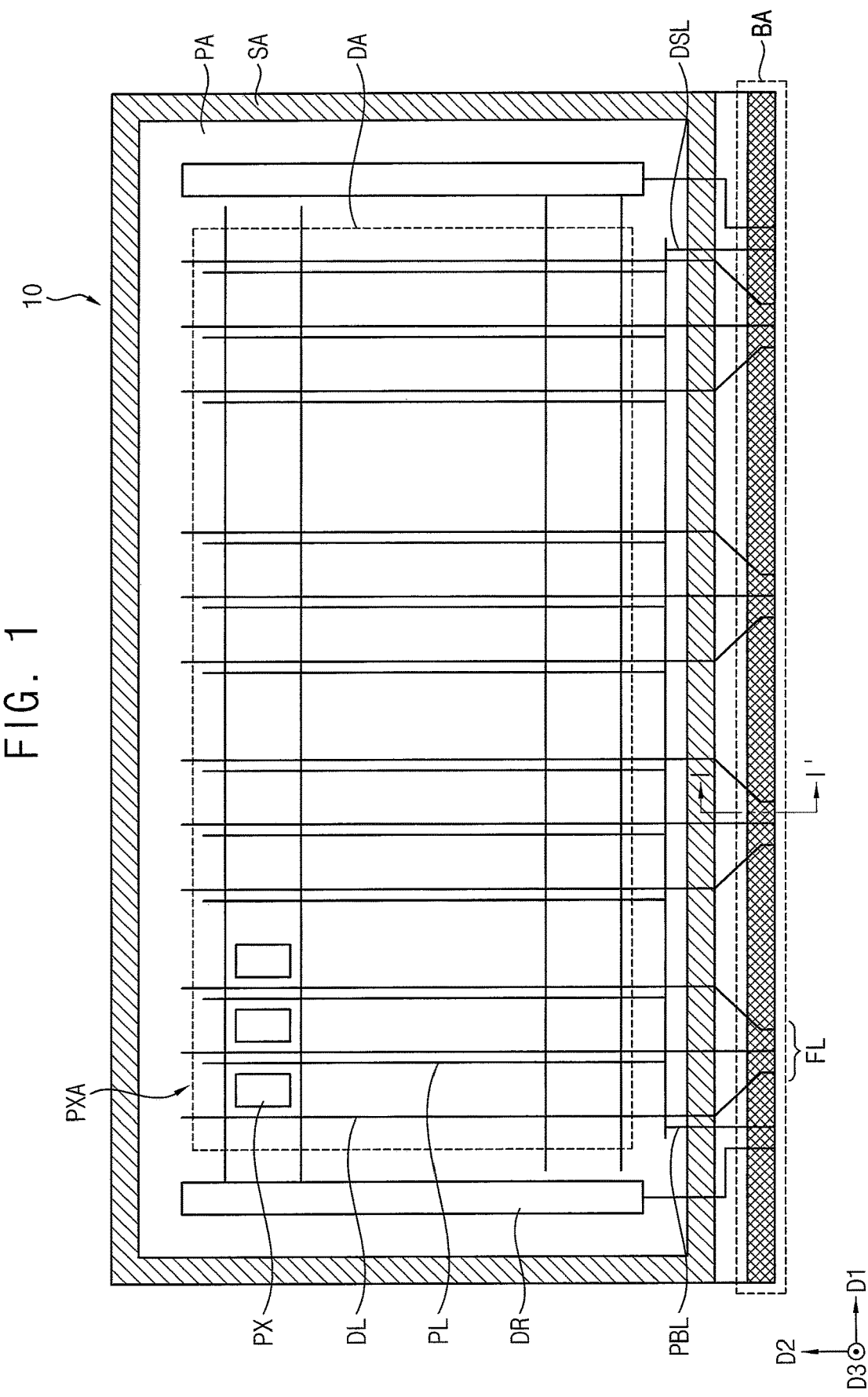
FIG. 1 is a plan view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
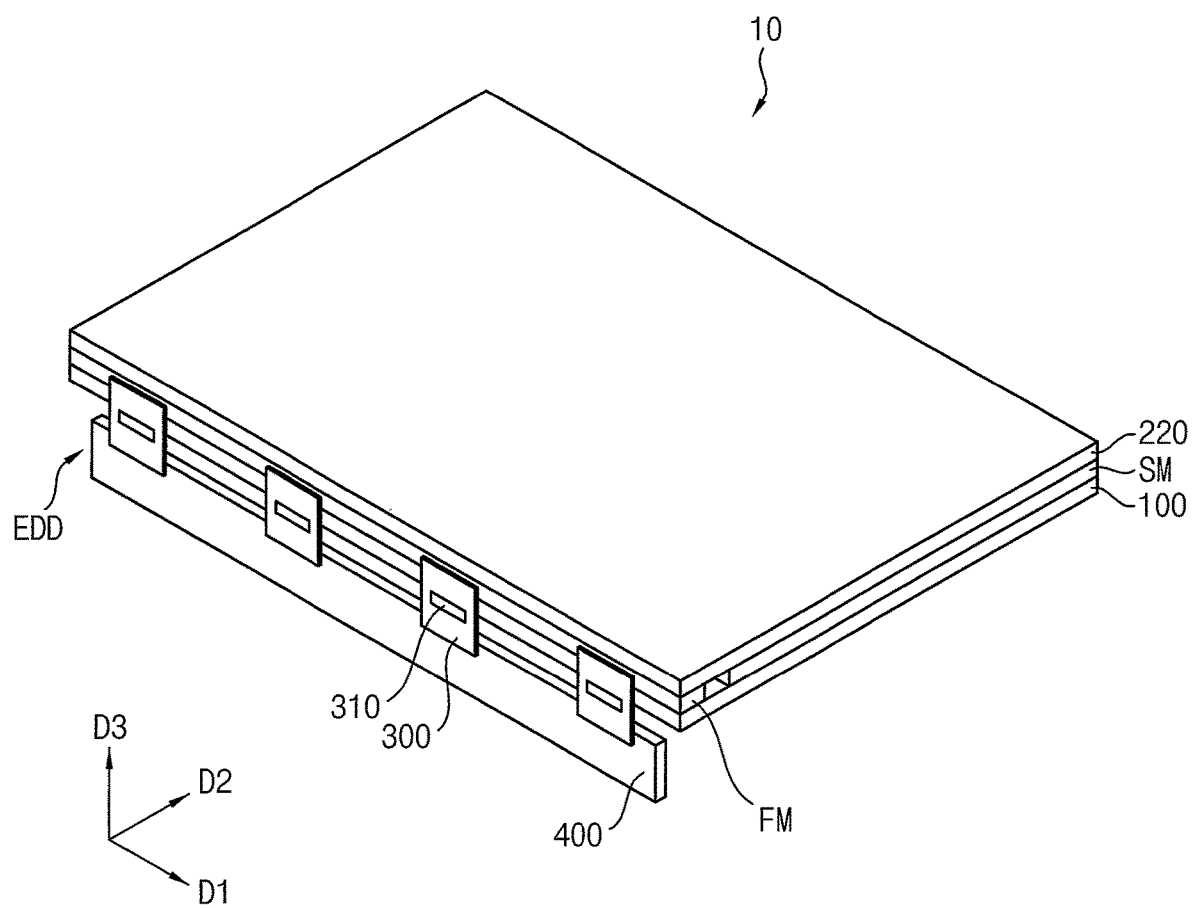
FIG. 2 is a perspective view illustrating an exemplary embodiment of the display device of FIG. 1.

FIG. 1 is a plan view illustrating an exemplary embodiment of a display device constructed according to principles of the invention. FIG. 2 is a perspective view illustrating an exemplary embodiment of the display device of FIG. 1.

Referring to FIGS. 1 and 2, the display device 10 according to an exemplary embodiment includes the display area DA and the peripheral area PA surrounding or adjacent to the display area DA. The display area DA may generate a light or may adjust transmittance of a light provided by an external light source to display an image. The peripheral area PA may be defined as an area not displaying an image.

In an exemplary embodiment, the display device 10 may be an organic light-emitting display device. For example, an array of pixels PX including a light-emitting element may be disposed in the display area DA to generate a light in response to a driving signal. A signal wiring and a power wiring may be disposed in the display area DA to transfer a driving signal and a power to the pixels PX. For example, a gate line GL, a data line DL and a power line PL may be disposed in the display area DA. The gate line GL may extend along a first direction D1 and may provide a gate signal to the pixels PX. The data line DL may extend along a second direction D2 crossing the first direction D1 and may provide a data signal to the pixels PX. The power line PL may extend along the second direction D2 and may provide a power to the pixels PX.

A transfer wiring, a circuit part or the like may be disposed in the peripheral area PA. The transfer wiring, discussed hereinafter, may transfer a driving signal or a power to the display area DA. The circuit part may generate a driving signal. For example, a driver DR generating a gate signal, a control signal wiring DSL transferring a control signal to the driver DR, a fan-out wiring FL, which may be a type of transfer wiring, transferring a data signal to the data line DL, a power bus wiring PBL transferring a power to the power line PL or the like may be disposed in the peripheral area PA.

In an exemplary embodiment, the peripheral area PA includes a sealing area SA in which a seal, such as sealing member SM, is disposed. The sealing area SA may have a shape surrounding the display area DA.

The transfer wiring may extend to the side end of the peripheral area PA. An end of the transfer wiring is electrically connected to the side terminal. The side terminal is electrically connected to an external driving device EDD. Thus, the transfer wiring may be electrically connected to the external driving device EDD to receive a driving signal, a control signal, a power or the like.

The bonding area BA may be defined by an area in which side terminals are disposed. For example, the side terminals may be arranged along the first direction D1 in the bonding area BA. A filling member FM covering the side terminals may be disposed in the bonding area BA, as shown FIG. 4. In an exemplary embodiment, the external driving device EDD is bonded to the side surface of a display panel, discussed in further detail hereinafter.

For example, as illustrated in FIG. 2, the display device 10 may include an array substrate 100, a cover substrate 220 connected with the array substrate 100, a sealing member SM disposed between the array substrate 100 and the cover substrate 220 and a filling member FM disposed between the array substrate 100 and the cover substrate 220. The filling member FM may extend along the first direction D1.

As discussed in further detail hereinafter, the side surface of the side terminal or a conductive connection pad connected to the side terminal is exposed through the side surface of the display panel. Thus, the external driving device EDD may be bonded to the side surface of the display panel to be electrically connected to the transfer wiring. An upper surface of the side terminal may be covered by the filling member FM. Thus, the contact area of the side terminal and the conductive connection pad may be substantially defined by the exposed side surface of the side terminal.

For example, the external driving device EDD may include a flexible printed circuit board 300, on which a driving chip 310 is mounted, and a printed circuit board 400 electrically connected to the flexible printed circuit board 300. The driving chip 310 may transfer a data signal to the transfer wiring through the flexible printed circuit board 300. The printed circuit board 400 may transfer a control signal, a power or the like to the transfer wiring through flexible printed circuit board 300.

Figure 3:
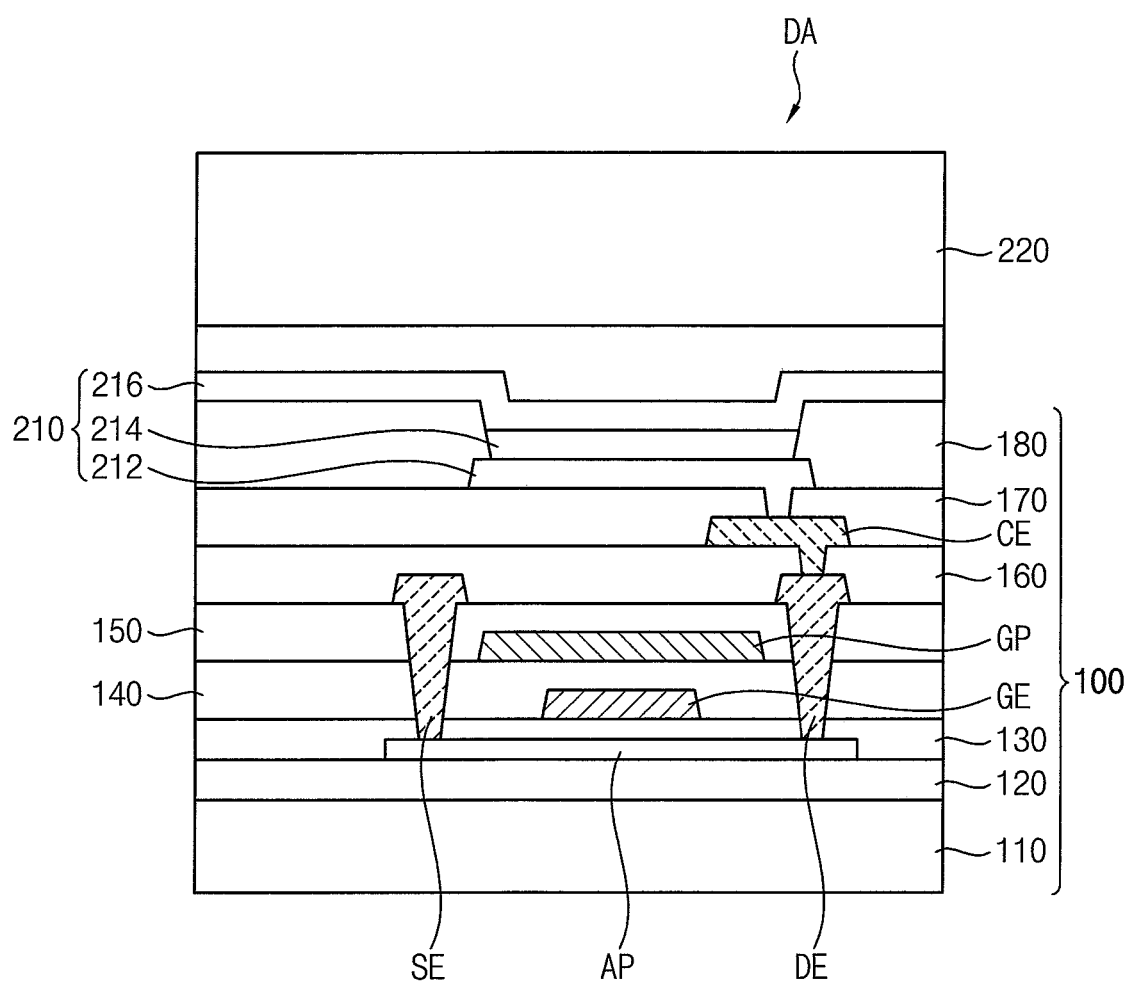
FIG. 3 is a cross-sectional view illustrating the display area of the display device of FIG. 1.

FIG. 3 is a cross-sectional view illustrating the display area of the display device of FIG. 1. Referring to FIG. 3, a pixel unit disposed in the display area DA may include a driving element disposed on a base substrate 110 and a light-emitting element electrically connected to the driving element. In an exemplary embodiment, the light-emitting element may be an organic light-emitting diode. The driving element may include at least one thin film transistor.

An active pattern AP may be disposed on the buffer layer 120. A buffer layer 120 may be disposed on the base substrate 110. For example, the base substrate 110 may include glass, quartz, sapphire, a polymeric material or the like. In an exemplary embodiment, the base substrate 110 may include a transparent rigid material such as glass. The buffer layer 120 may prevent or reduce permeation of impurities, humidity or external gas from underneath of the base substrate 110, and may planarize an upper surface of the base substrate 110. For example, the buffer layer 120 may include an inorganic material such as oxide, nitride or the like.

A first gate metal pattern including a gate electrode GE may be disposed on the active pattern AP. A first insulation layer 130 may be disposed between the active pattern AP and the gate electrode GE.

A second gate metal pattern including a gate wiring pattern GP may be disposed on the gate electrode GE. The gate wiring pattern GP may include a capacitor electrode for forming a capacitor, a wiring for transferring various signals or the like.

A second insulation layer 140 may be disposed between the gate electrode GE and the gate wiring pattern GP. A third insulation layer 150 may be disposed on the gate wiring pattern GP.

For example, the active pattern AP may include at least one of a silicon or a metal oxide semiconductor. In an exemplary embodiment, the active pattern AP may include polycrystalline silicon (polysilicon), which may be doped with at least one of n-type impurities or p-type impurities.

In another exemplary embodiment of another transistor, an active pattern may include a metal oxide semiconductor. For example, the active pattern may include at least one of a two-component compound ($AB_x$), a ternary compound ($AB_xC_y$) or a four-component compound ($AB_xC_yD_z$), which may include at least one of indium (In), zinc (Zn), gallium (Ga), tin (Sn), titanium (Ti), aluminum (Al), hafnium (Hf), zirconium (Zr), and magnesium (Mg). For example, the active pattern may include at least one of a zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may include at least one of silicon oxide, silicon nitride, silicon carbide or a combination thereof. Furthermore, the first insulation layer 130, the second insulation layer 140 and the third insulation layer 150 may include an insulating metal oxide such as at least one of aluminum oxide, tantalum oxide, hafnium oxide, zirconium oxide, titanium oxide or the like. For example, the first insulation layer 130, the second insulation layer 140 and the third insulation layer 150 may have a single-layered structure or a multi-layered structure including at least one of silicon nitride and/or silicon oxide, respectively, or may have different structures from each other.

The gate electrode GE and the gate wiring pattern GP may include at least one of a metal, a metal alloy, a metal nitride, a conductive metal oxide or the like. For example, the gate electrode GE and the gate wiring pattern GP may include at least one of gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may pass through the insulation layers disposed thereunder to contact the active pattern AP, respectively.

A fourth insulation layer 160 may be disposed on the first source metal pattern. A second source metal pattern may be disposed on the fourth insulation layer 160. The second source metal pattern may include a connection electrode CE to electrically connect the drain electrode DE to an organic light-emitting diode 210 disposed thereon. In an exemplary embodiment, the second source metal pattern may further include a mesh power line to prevent voltage drop of a power applied to the organic light-emitting diode 210. A fifth insulation layer 170 may be disposed on the second source metal pattern.

The first and second source metal patterns may include at least one of a metal, a metal alloy, a metal nitride, a conductive metal oxide or the like. For example, the first and second source metal patterns may include at least one of gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment, the first and second source metal patterns may have a multi-layered structure including an aluminum layer.

The fourth insulation layer 160 and the fifth insulation layer 170 may include an organic material. For example, the fourth insulation layer 160 and the fifth insulation layer 170 may include an organic insulation material such as at least one of a phenol resin, an acryl resin, a polyimide resin, a polyamide resin, a siloxane resin, an epoxy resin or the like.

An organic light-emitting diode 210 may be disposed on the fifth insulation layer 170. The organic light-emitting diode 210 may include a first electrode 212 contacting the connection electrode CE, a light-emitting layer 214 disposed on the first electrode 212 and a second electrode 216 disposed on the light-emitting layer 214. The light-emitting layer 214 of the organic light-emitting diode 210 may be disposed at least in an opening of a pixel-defining layer 180 disposed on the fifth insulation layer 170. The first electrode 212 may be a lower electrode of the organic light-emitting diode 210, and the second electrode 216 may be an upper electrode of the organic light-emitting diode 210.

The first electrode 212 may function as an anode. For example, the first electrode 212 may be formed as a transmitting electrode or a reflecting electrode according to an emission type of the display device. When the first electrode 212 is a transmitting electrode, the first electrode 212 may include at least one of indium tin oxide, indium zinc oxide, zinc tin oxide, indium oxide, zinc oxide, tin oxide or the like. When the first electrode 212 is a reflecting electrode, the first electrode 212 may include at least one of gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 180 has an opening overlapping at least a portion of the first electrode 212. For example, the pixel-defining layer 180 may include an organic insulating material.

The light-emitting layer 214 may include at least an organic light-emitting layer, and may further include at least one of a hole injection layer (HIL), a hole transporting layer (HTL), an electron transporting layer (ETL) and an electron injection layer (EIL). For example, the light-emitting layer 214 may include a low molecular weight organic compound or a high molecular weight organic compound.

In an exemplary embodiment, the light-emitting layer 214 may emit a red light, a green light or a blue light. In another exemplary embodiment, the light-emitting layer 214 may emit a white light. The light-emitting layer 214 emitting white light may have a multi-layer structure including a red-emitting layer, a green-emitting layer and a blue-emitting layer, or a single-layer structure including a mixture of a red-emitting material, a green-emitting material and a blue-emitting material.

The second electrode 216 may be formed as a transmitting electrode or a reflecting electrode according to an emission type of the display device. For example, the second electrode 216 may include at least one of a metal, a metal alloy, a metal nitride, a metal fluoride, a conductive metal oxide or a combination thereof.

For example, the second electrode 216 may be formed as a common layer extending continuously over a plurality of pixels in the display area DA.

A cover substrate 220 is disposed on the organic light-emitting diode 210. For example, the cover substrate 220 may include at least one of glass, quartz, sapphire, a polymeric material or the like. In an exemplary embodiment, the cover substrate 220 may include a transparent rigid material such as glass.

For example, a spacer may be disposed under the cover substrate 220 to support the cover substrate 220. The spacer may be disposed between the cover substrate 220 and the organic light-emitting diode 210 or between the pixel-defining layer 180 and the second electrode 216 of the organic light-emitting diode 210.

The space between the cover substrate 220 and the organic light-emitting diode 210 may have a vacuum state or may be filled with a gas or a display area sealing member. The display area sealing member may include an organic layer, an inorganic layer or a combination thereof.

Figure 4:
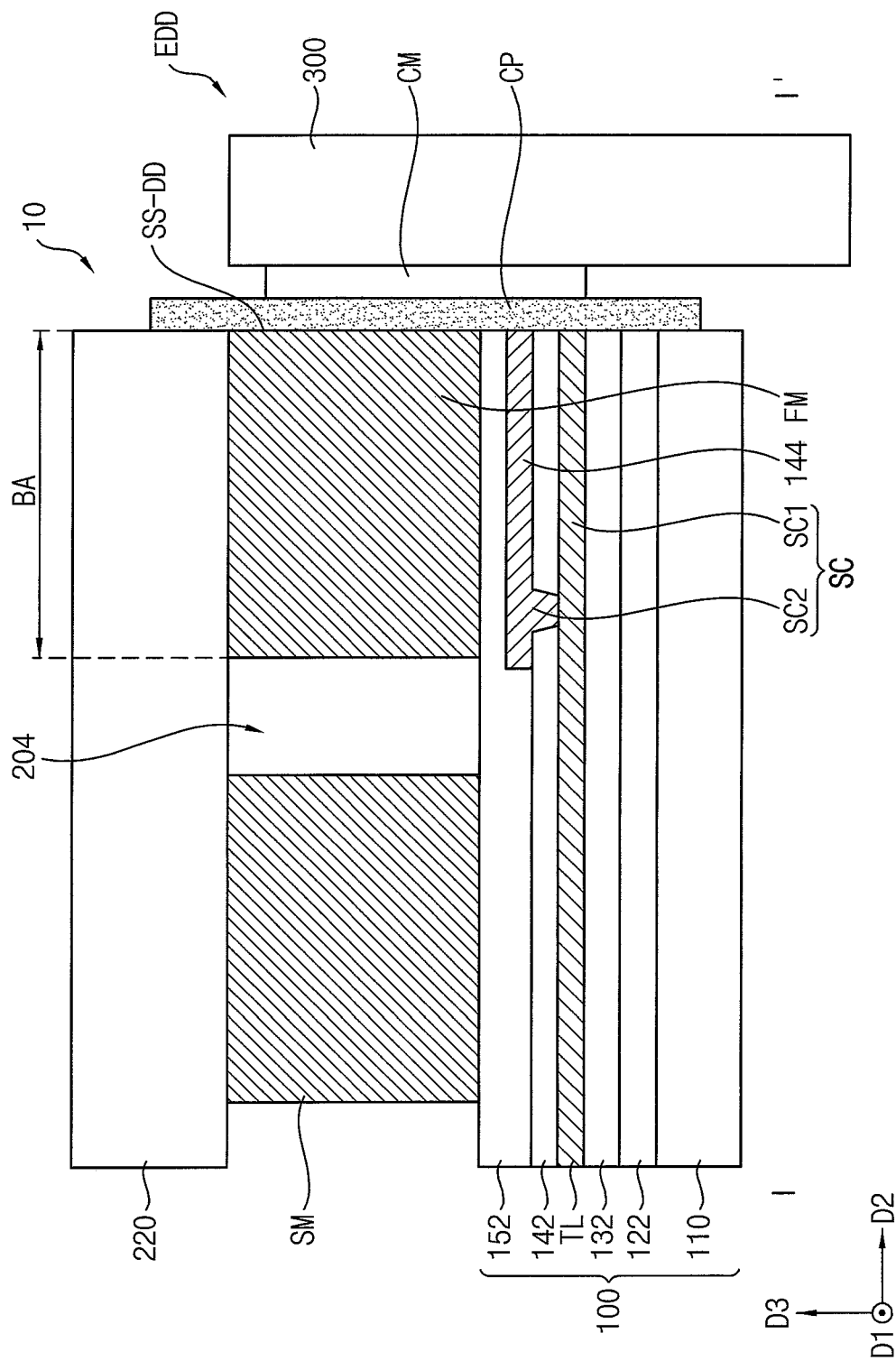
FIG. 4 is a cross-sectional view illustrating the bonding area of the display device taken along line I-I' of FIG. 1.
Figure 5:
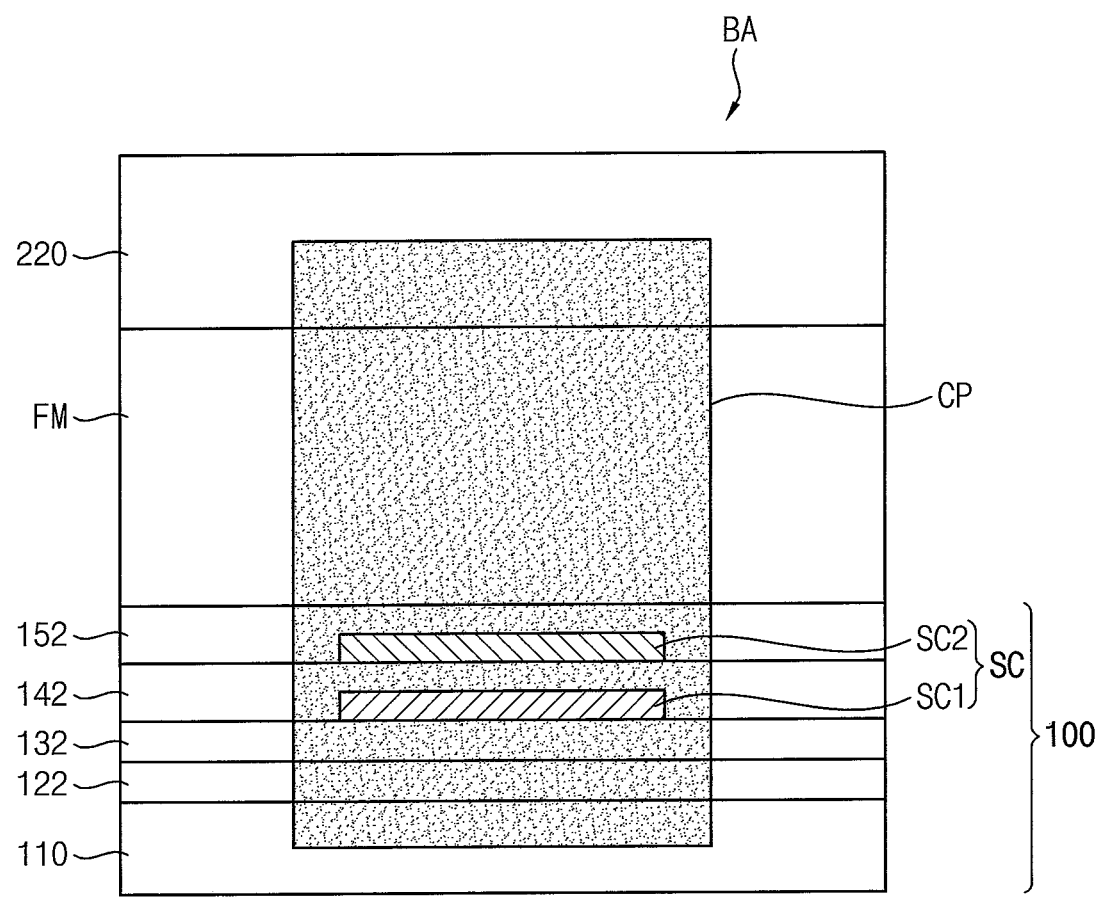
FIG. 5 is a side, elevational view illustrating the bonding area of the display device of FIG. 4.

FIG. 4 is a cross-sectional view illustrating the bonding area of the display device taken along line I-I' of FIG. 1. FIG. 5 is a side, elevational view illustrating the bonding area of the display device of FIG. 4.

Referring to FIGS. 3 to 5, a transfer wiring TL may extend toward a side surface SS-DD of the display device 10 in the bonding area BA, typically at the array substrate 100. In an exemplary embodiment, the transfer wiring TL may be the fan-out wiring FL illustrated in FIG. 1. However, exemplary embodiments are not limited thereto. For example, the transfer wiring TL may be the power bus wiring PBL, the control signal wiring DSL or a bridge wiring connected thereto.

A buffer layer 122 and a first insulation layer 132 may be disposed between the transfer wiring TL and the base substrate 110 in the bonding area BA. The buffer layer 122 and the first insulation layer 132 may extend from the buffer layer 120 and the first insulation layer 130, which are disposed in the display area DA, or may be formed from same layers as the buffer layer 120 and the first insulation layer 130.

In an exemplary embodiment, the transfer wiring TL may be formed from and disposed in a same layer as the gate electrode GE disposed in the display area DA.

The side terminal SC electrically contacts the transfer wiring TL, and extends to the side surface SS-DD of the display device 10 to be exposed to the exterior. In an exemplary embodiment, the side terminal SC may have a multi-layered structure including a plurality of conductive layers SC1 and SC2. The filling member FM may overlap at least a portion 144 of the side terminal SC.

For example, the side terminal SC may include a first conductive layer SC1 extending from the transfer wiring TL and a second conductive layer SC2 disposed on the first conductive layer SC1. However, exemplary embodiments are not limited thereto, and the side terminal SC may have various structures depending on the structure of a pixel array disposed in the display area DA. For example, the side terminal SC may include at least one conductive layer. Preferably, the side terminal SC may include at least two conductive layers to increase the contact area.

In an exemplary embodiment, the transfer wiring TL and the first conductive layer SC1 extending from the transfer wiring TL may be formed from and disposed in a same layer as the gate electrode GE disposed in the display area DA. The second conductive layer SC2 may be formed from and disposed in a same layer as the gate wiring pattern GP disposed in the display area DA.

For example, a second insulation layer 142 may be disposed between the first conductive layer SC1 and the second conductive layer SC2, and a third insulation layer 152 may be disposed on the second conductive layer SC2.

For example, the second conductive layer SC2 may pass through the second insulation layer 142 to electrically contact the first conductive layer SC1.

The second insulation layer 142 and the third insulation layer 152 may extend from the second insulation layer 140 and the third insulation layer 150, which are disposed in the display area DA, or may be formed from same layers as the second insulation layer 140 and the third insulation layer 150.

In an exemplary embodiment, a filling member FM is disposed between the array substrate 100 and the cover substrate 220. The filling member FM may fill part of a space 204 between the side terminal SC and the cover substrate 220 in the bonding area BA to prevent impurities from entering the display device 10 or to prevent undercutting of the side terminal SC in the process of grinding the side surface SS-DD of the display device 10.

In an exemplary embodiment, the filling member FM may include an inorganic material. For example, the filling member FM may be formed from at least one of glass frit, ceramic frit or the like. In view of process efficiency, the filling member FM and the sealing member SM may be preferably formed from the same material, for example, glass frit. In an exemplary embodiment, a frit paste may be coated on the bonding area BA, and then sintered by UV ray, laser or the like to form the filling member FM.

In an exemplary embodiment, insulation layers including an organic material may be removed in the area overlapping the sealing member SM and the filling member FM. When the insulation layers including an organic material are disposed in the area overlapping the sealing member SM and the filling member FM, outgas may be caused by heat in the process of curing or sintering the sealing member SM and the filling member FM.

In an exemplary embodiment, the filling member FM may be spaced apart from the sealing member SM. A conductive connection pad CP may be disposed on a side surface SS-DD of the display device 10. The conductive connection pad CP may contact the side terminal SC. The conductive connection pad CP may extend along a vertical direction. For example, the conductive connection pad CP may extend along a vertical direction to cover at least a portion of the side surface of the base substrate 110 or the cover substrate 220.

The conductive connection pad CP may include a metal. For example, a metal layer may be formed by depositing a metal such as at least one of gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or the like. The metal layer may be patterned, for example, by laser to form the conductive connection pad CP. However, exemplary embodiments are not limited thereto. For example, a metal pattern may be directly formed by using a mask having an opening. The conductive connection pad CP may be bonded to a flexible printed circuit board 300 by a conductive connection member CM.

The conductive connection member CM may be formed by various methods. For example, the conductive connection member CM may be an anisotropic conductive film ACF having conductive particles dispersed therein. In another exemplary embodiment, the conductive connection member CM may be a conductive bump bonded to the conductive connection pad CP, for example, by supersonic welding or the like. However, exemplary embodiments are not limited thereto, and various conventional boding methods may be used for bonding the conductive connection pad CP to the flexible printed circuit board 300 and for forming the conductive connection member CM.

According to exemplary embodiments, the side surface SS-DD of a display device 10 is bonded to an external driving device EDD thereby reducing the size of the peripheral area PA (bezel) of the display device 10. Furthermore, a filling member FM is formed of an inorganic material for protecting the side terminal SC. Thus, outgas from the filling member may be prevented in the process of forming a conductive connection pad.

Figure 6:
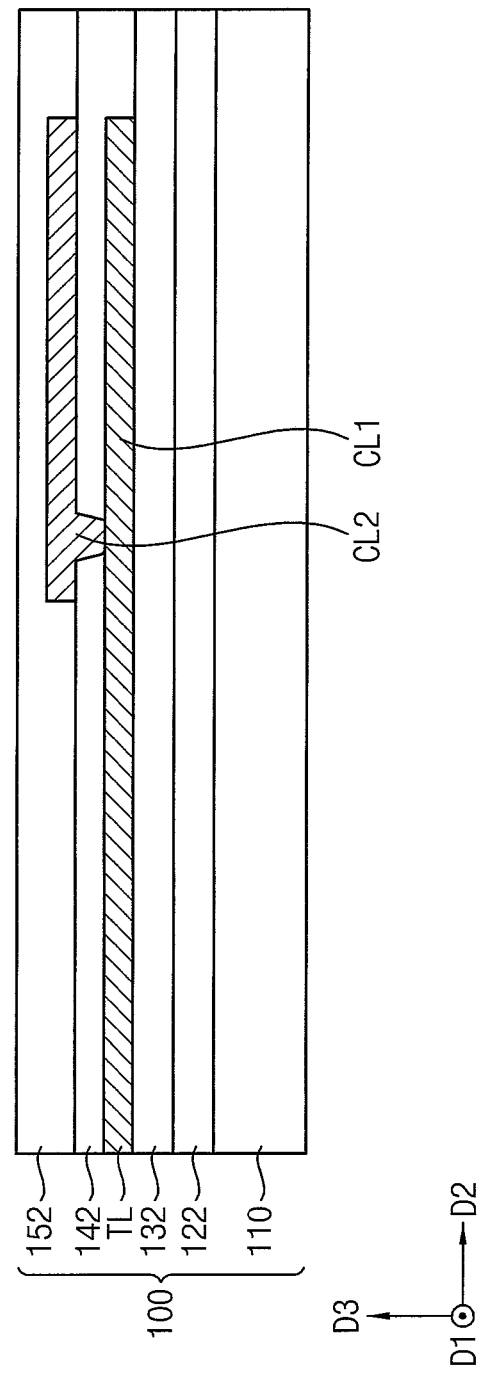
FIGS. 6 to 11 are cross-sectional views illustrating exemplary methods of manufacturing the display device according to principles of the invention.

FIGS. 6 to 11 are cross-sectional views illustrating exemplary methods of manufacturing the display device according to principles of the invention. Referring to FIG. 6, a buffer layer 122 is formed on a base substrate 110. A first insulation layer 132 is formed on the buffer layer 122. A transfer wiring TL is formed on the first insulation layer 132. A second insulation layer 142 is formed on the transfer wiring TL. An end of the transfer wiring TL may define a first conductive pattern CL1. A second conductive pattern CL2 is formed on the second insulation layer 142. The second conductive pattern CL2 contacts the first conductive pattern CL1. A third insulation layer 152 is formed on the second conductive pattern CL2. The above insulation layers and conductive patterns may be formed in the process of forming a thin film transistor disposed in the display area DA. The base substrate 110, a pixel array formed on the base substrate and a structure in the bonding area BA may be integrally referred as an array substrate 100.

Figure 7:
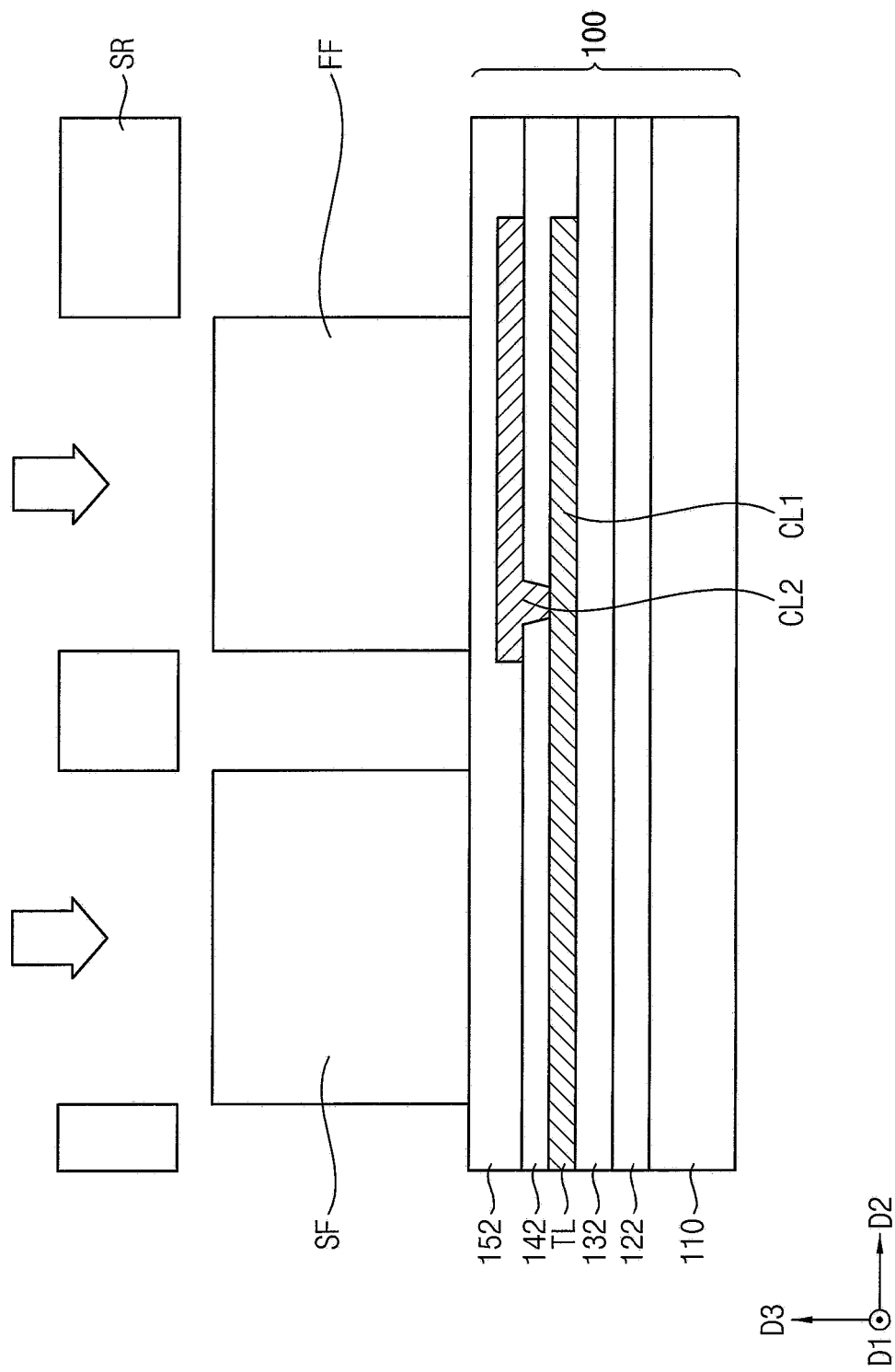

Referring to FIG. 7, a sealing frit SF and a filing frit FF are formed on the array substrate 100. In an exemplary embodiment, a screen printing method or a dispensing method may be used for disposing the sealing frit SF and the filing frit FF on the array substrate 100. For example, a screen SR is disposed on the array substrate 100. The screen SR may have an opening corresponding to the shape and dimension of a sealing member and a filling member. A frit paste is provided on the area corresponding to the sealing member and the filling member through the opening thereby forming the sealing frit SF and the filing frit FF.

The sealing frit SF and the filing frit FF may be formed from the same material. For example, the sealing frit SF and the filing frit FF may include a glass. For example, the glass frit may include at least one of an oxide powder, a binder and a solvent. For example, the oxide powder may include at least one of lead oxide (PbO), silicon oxide ($SiO_2$), zinc oxide (ZnO), bismuth oxide ($Bi_2O_3$), boron oxide ($B_2O_3$, $B_2O_8$), iron oxide ($Fe_2O_3$), aluminum oxide ($Al_2O_3$) or a combination thereof.

Figure 8:
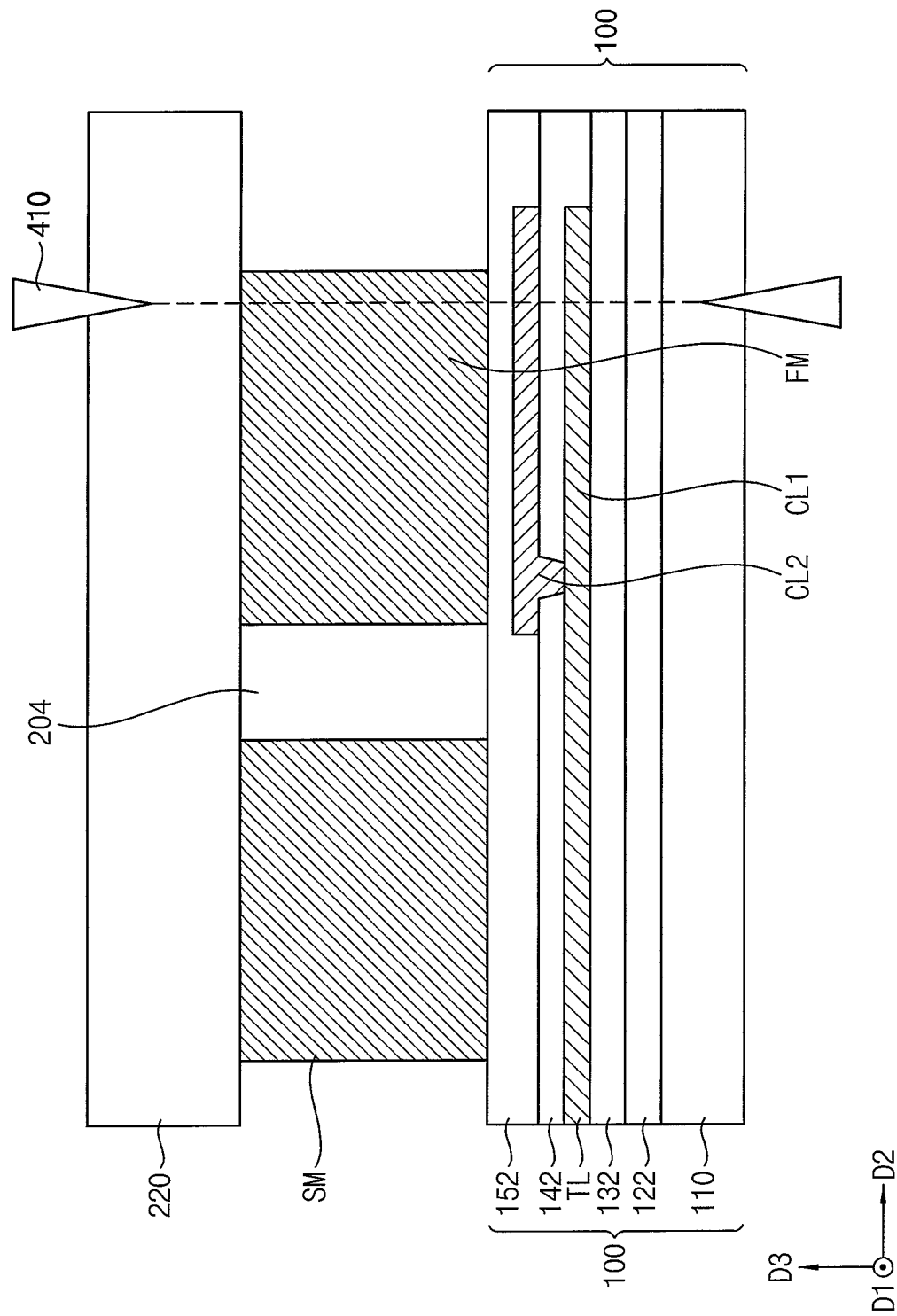

Referring to FIG. 8, a cover substrate 220 is disposed on the sealing frit SF and the filing frit FF. The sealing frit SF and the filing frit FF are heated by at least one of heat, UV, laser or the like. As a result, the array substrate 100 and the cover substrate 220 are connected with each other, and the sealing frit SF and the filing frit FF are sintered to form the sealing member SM and the filling member FM.

The binder and the solvent in the sealing frit SF and the filing frit FF may be removed in the process of drying or sintering. Thus, the sealing member SM and the filling member FM may substantially consist of an inorganic material.

In another exemplary embodiment, the sealing member SM and the filling member FM may include different materials from each other. For example, the sealing member SM may include a polymeric material formed from a curable resin, and the filling member FM may include a glass formed from glass frit. For example, the curable resin may include at least one of an epoxy resin, a silicone resin, an acrylic resin, an urethane resin, a phenol resin or the like.

Thereafter, the formed display panel of the display device 10 is scribed. For example, the display panel may be scribed by a scribing member 410 such as a scribing wheel or the like. In an exemplary embodiment, the scribing member 410 may scribe the display panel along a direction vertical to an upper surface or a lower surface of the display panel.

In an exemplary embodiment, the cover substrate 220, the filling member FM, the first conductive pattern CL1, the second conductive pattern CL2 and the base substrate 110 of the array substrate may be scribed and partially removed.

Figure 9:
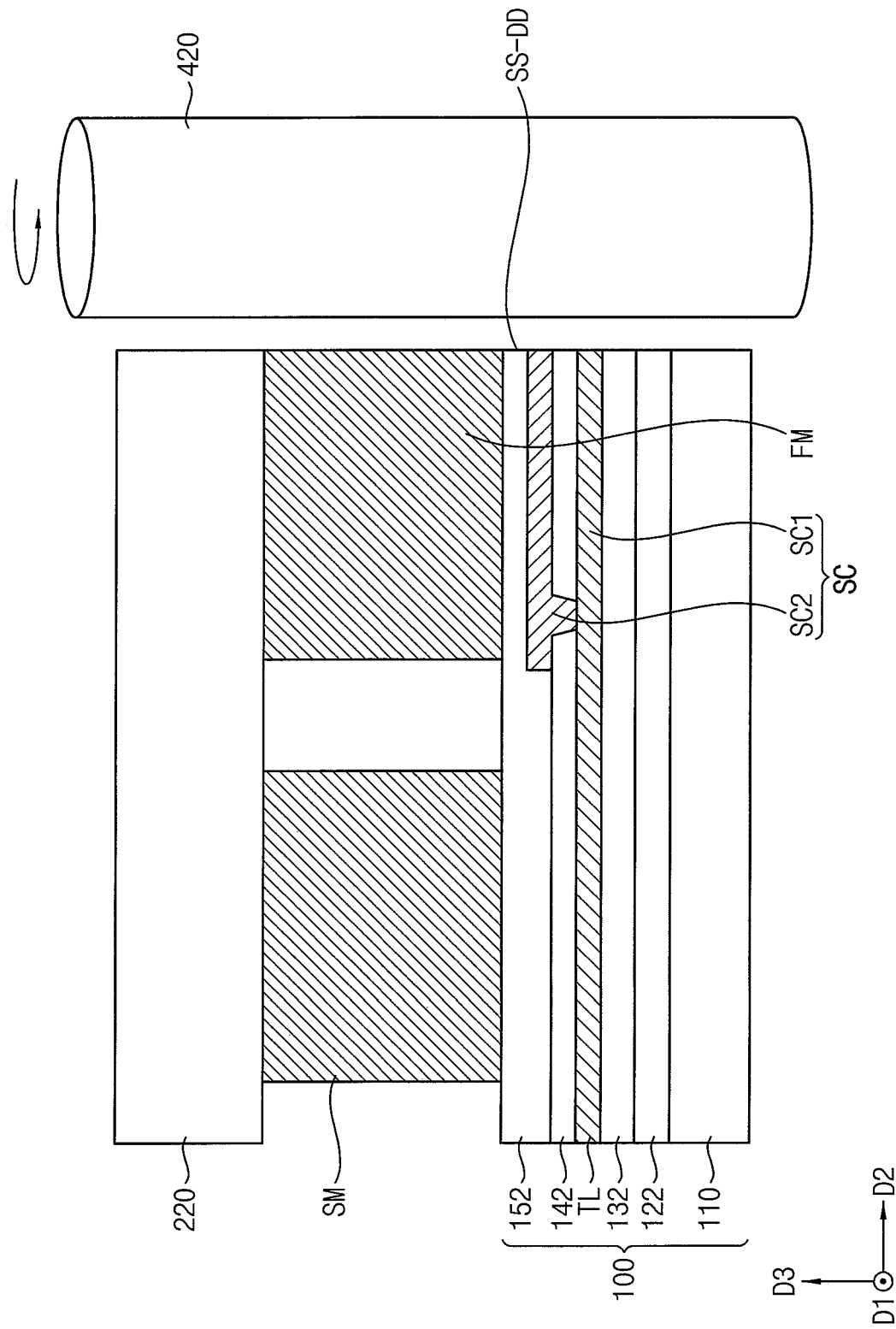

Referring to FIG. 9, remaining conductive layers SC1 and SC2 after scribing the first conductive pattern CL1 and the second conductive pattern CL2 may form the side terminal SC. The side surface of the side terminal SC may be exposed through the side surface SS-DD of the display panel.

In an exemplary embodiment, the side surface SS-DD of the display panel may be grinded or polished after scribing. A grinder 420 or a polishing machine may be used for grinding or polishing the side surface SS-DD of the display panel. A roughness of the side surface SS-DD of the display panel may be reduced through the grinding or polishing process.

Figure 10:
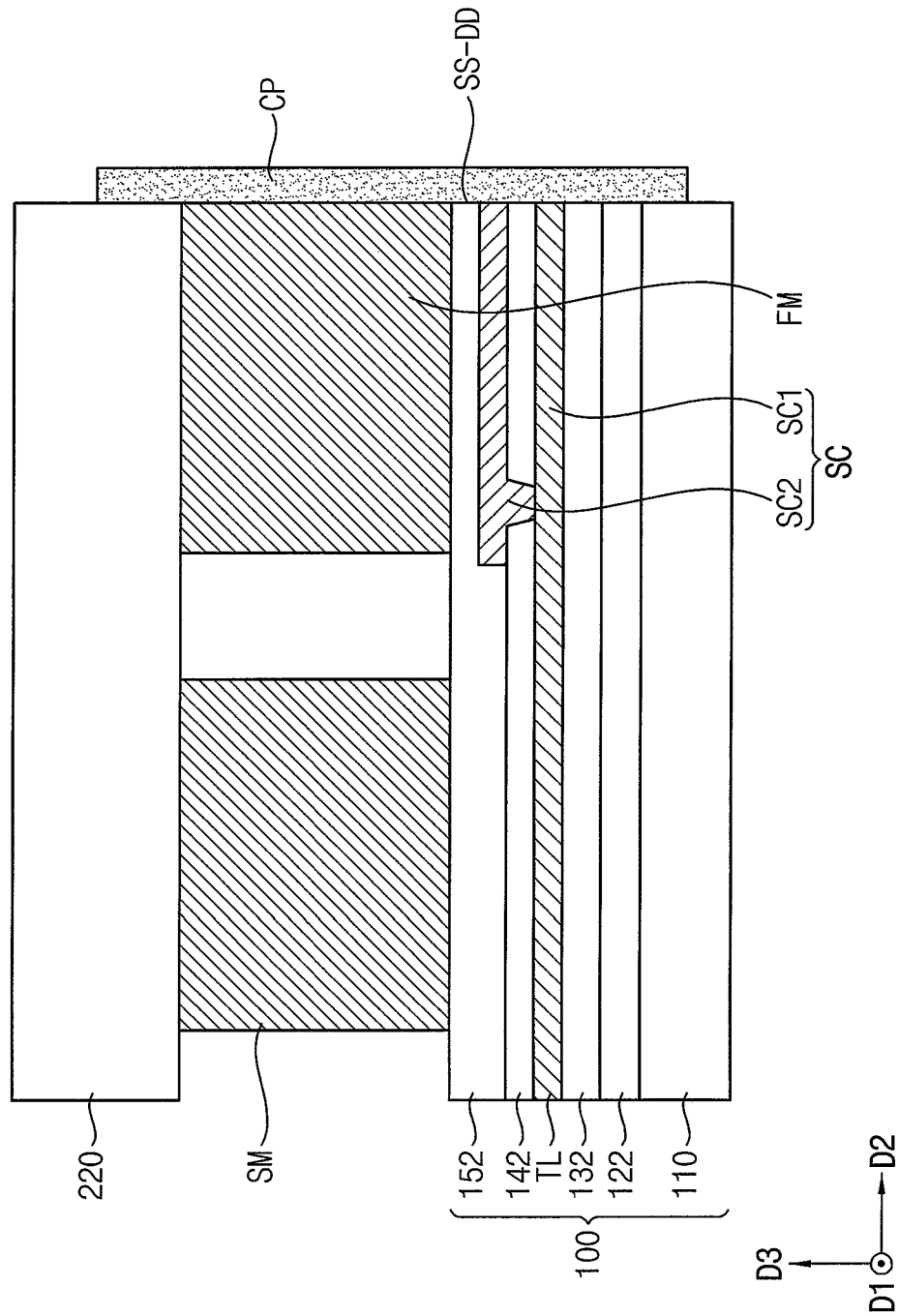

Referring to FIG. 10, a conductive connection pad CP is formed on the side surface SS-DD of the display panel, through which the side terminal SC is exposed.

For example, a metal layer is formed on the side surface SS-DD of the display panel through a deposition process such as sputtering or the like, and then patterned by laser or the like to form the conductive connection pad CP.

Thereafter, as illustrated in FIG. 4, the conductive connection pad CP is connected with an external driving device EDD by an anisotropic conductive film, supersonic welding or the like. As a result, the external driving device EDD may be electrically connected to the transfer wiring TL through the side terminal SC and the conductive connection pad CP.

According to exemplary embodiment, a filling member and a sealing member are formed in a same process. Thus, manufacturing efficiency may be improved. Furthermore, since the filling member is formed of an inorganic material, outgas from the filling member may be prevented or reduced. In another exemplary embodiment, a sealing frit SF and a filling frit FF may be formed on a cover substrate 220.

Figure 11:
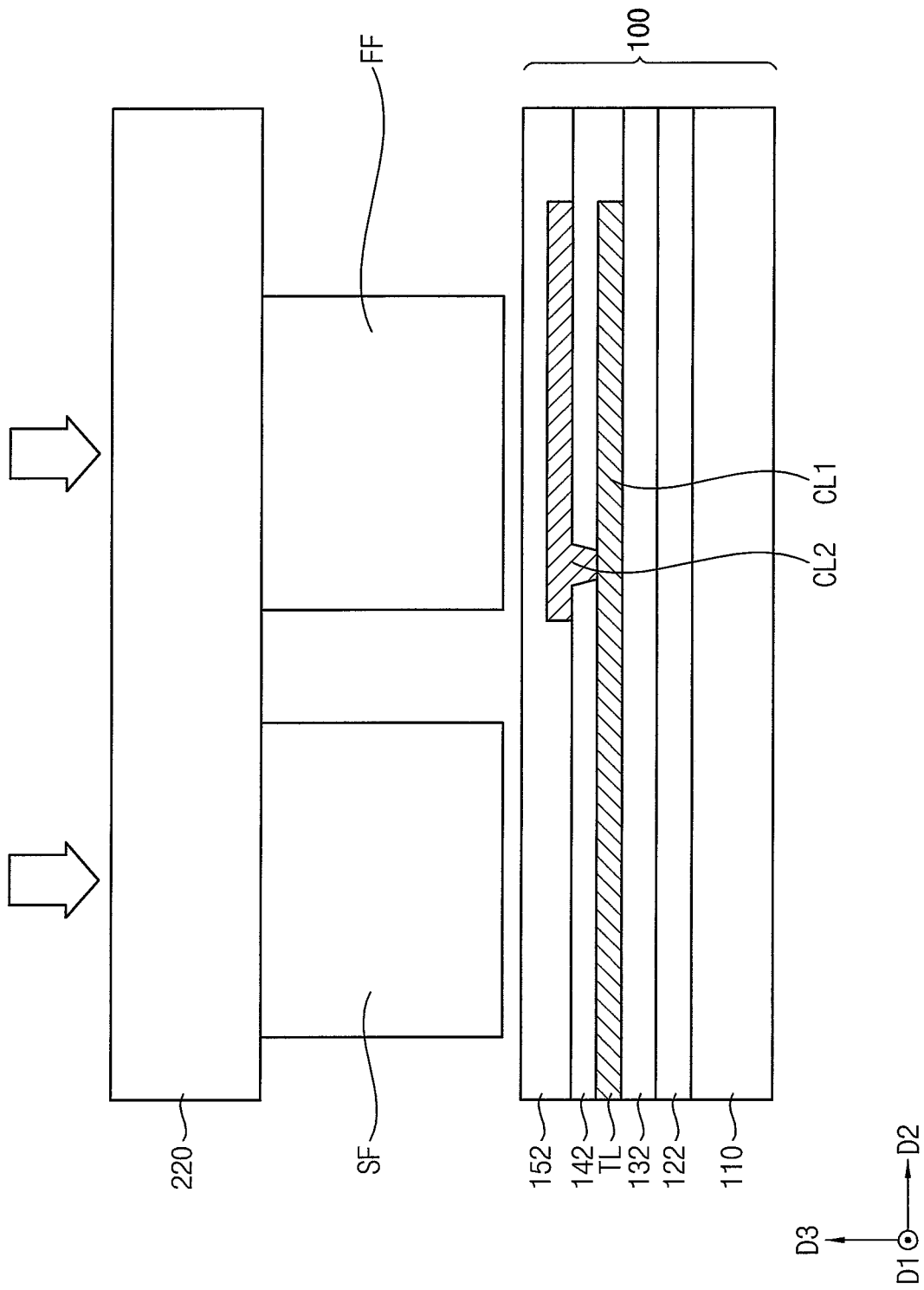

For example, as illustrated in FIG. 11, a sealing frit SF and a filling frit FF may be formed on a cover substrate 220. After the cover substrate 220 connected with the sealing frit SF and the filling frit FF is disposed to contact the array substrate 100, the sealing frit SF and the filling frit FF are sintered to form a sealing member SM and a filling member FM.

FIGS. 12 to 15 are cross-sectional views illustrating other exemplary embodiments of the bonding area of the display device taken along line I-I' of FIG. 1.

Figure 12:
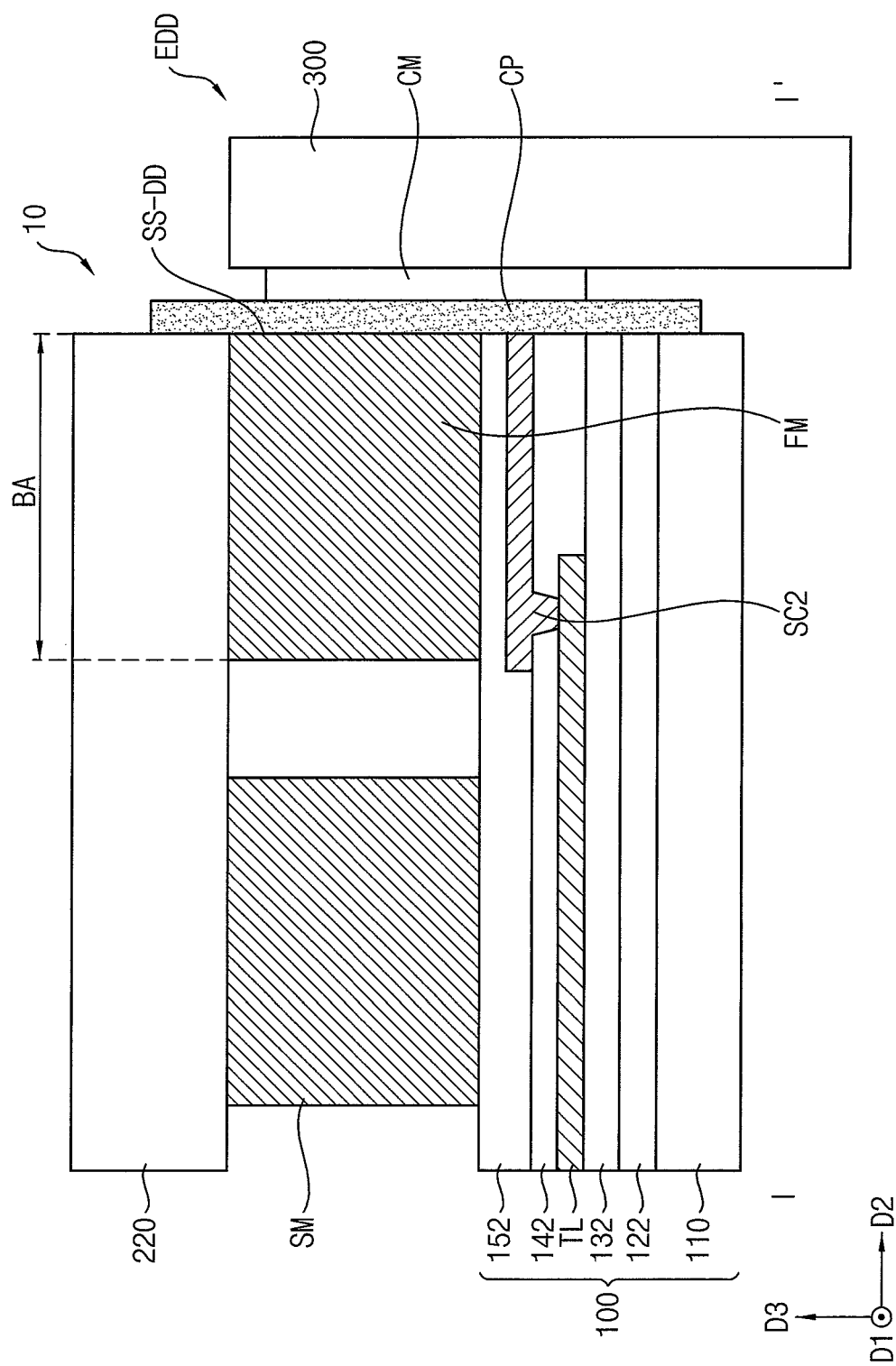
FIGS. 12 to 15 are cross-sectional views illustrating other exemplary embodiments of the bonding area of the display device taken along line I-I' of FIG. 1.

Referring to FIGS. 1 and 12, the display device 10 includes an array substrate 100, a cover substrate 220, a sealing member SM, a filling member FM and a conductive connection pad CP.

The array substrate 100 includes a pixel array PXA, a transfer wiring TL electrically connected to the pixel array PXA and the side terminal SC electrically connected to the transfer wiring TL. The cover substrate 220 is connected with the array substrate 100. The conductive connection pad CP contacts the side surface of the side terminal SC. An external driving device EDD such as a flexible printed circuit board 300 is bonded to the conductive connection pad CP.

The sealing member SM is disposed between the array substrate 100 and the cover substrate 220, and surrounds the pixel array PXA of the array substrate 100. The filling member FM is disposed between the side terminal SC and the cover substrate 220, and includes an inorganic material.

In an exemplary embodiment, the transfer wiring TL may not extend to the side surface SS-DD of the display device 10. Thus, the transfer wiring TL may be spaced apart from the conductive connection pad CP. The side terminal SC may include a conductive layer SC2 disposed on and electrically connected to the transfer wiring TL.

In an exemplary embodiment, the transfer wiring TL may not be exposed through the side surface SS-DD of the display panel. Thus, damage to the transfer wiring TL, which may be caused when the side surface SS-DD of the display panel is processed, may be prevented.

Figure 13:
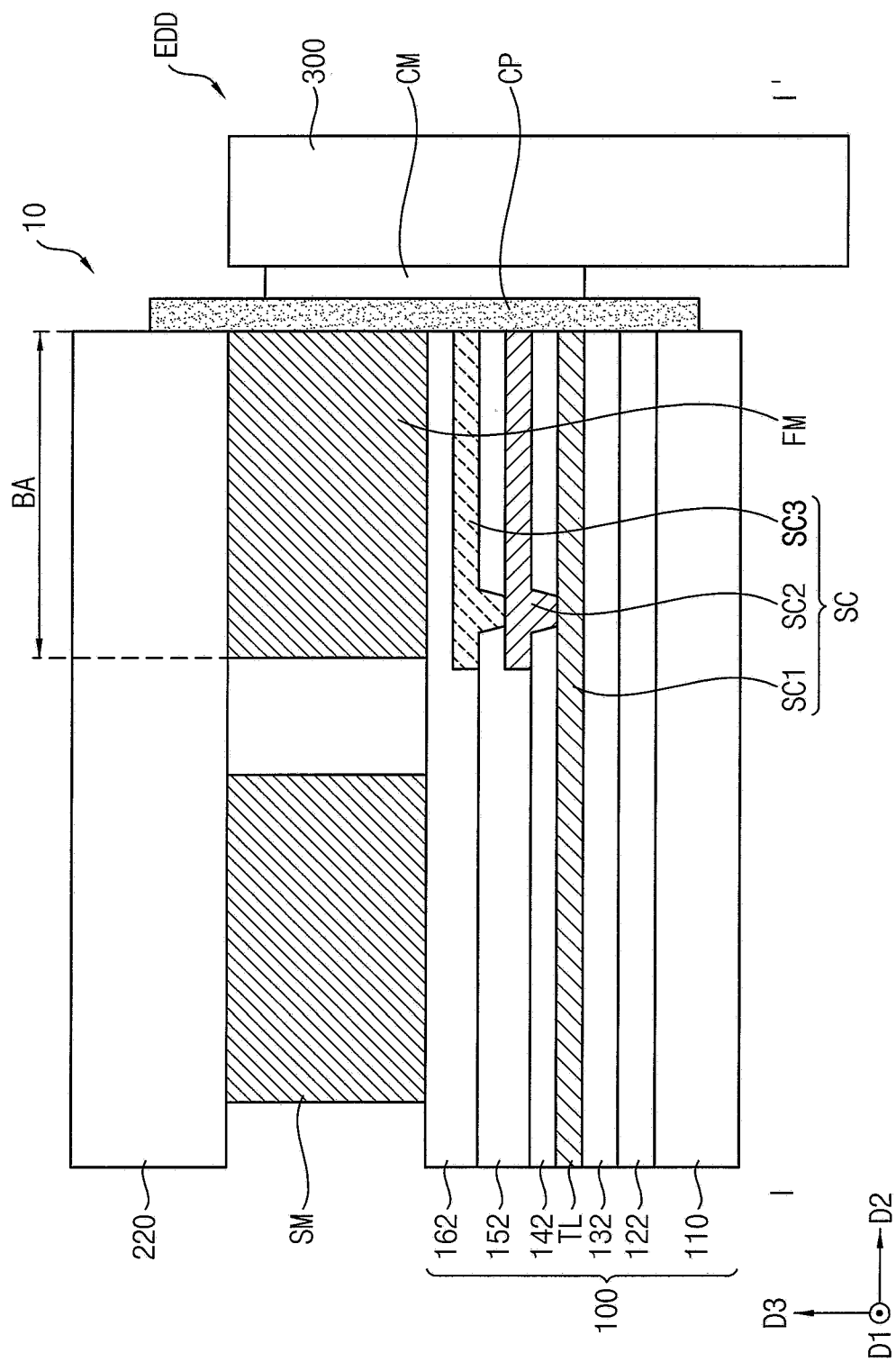

Referring to FIGS. 1 and 13, the side terminal SC includes a first conductive layer SC1 extending from a transfer wiring TL, a second conductive layer SC2 disposed on the first conductive layer SC1 and a third conductive layer SC3 disposed on the second conductive layer SC2. For example, the third conductive layer SC3 may be formed from a same layer as a first source metal pattern disposed in the display area DA.

A fourth insulation layer 162 may be disposed on the third conductive layer SC3. In an exemplary embodiment, the fourth insulation layer 162 may include an inorganic material.

Figure 14:
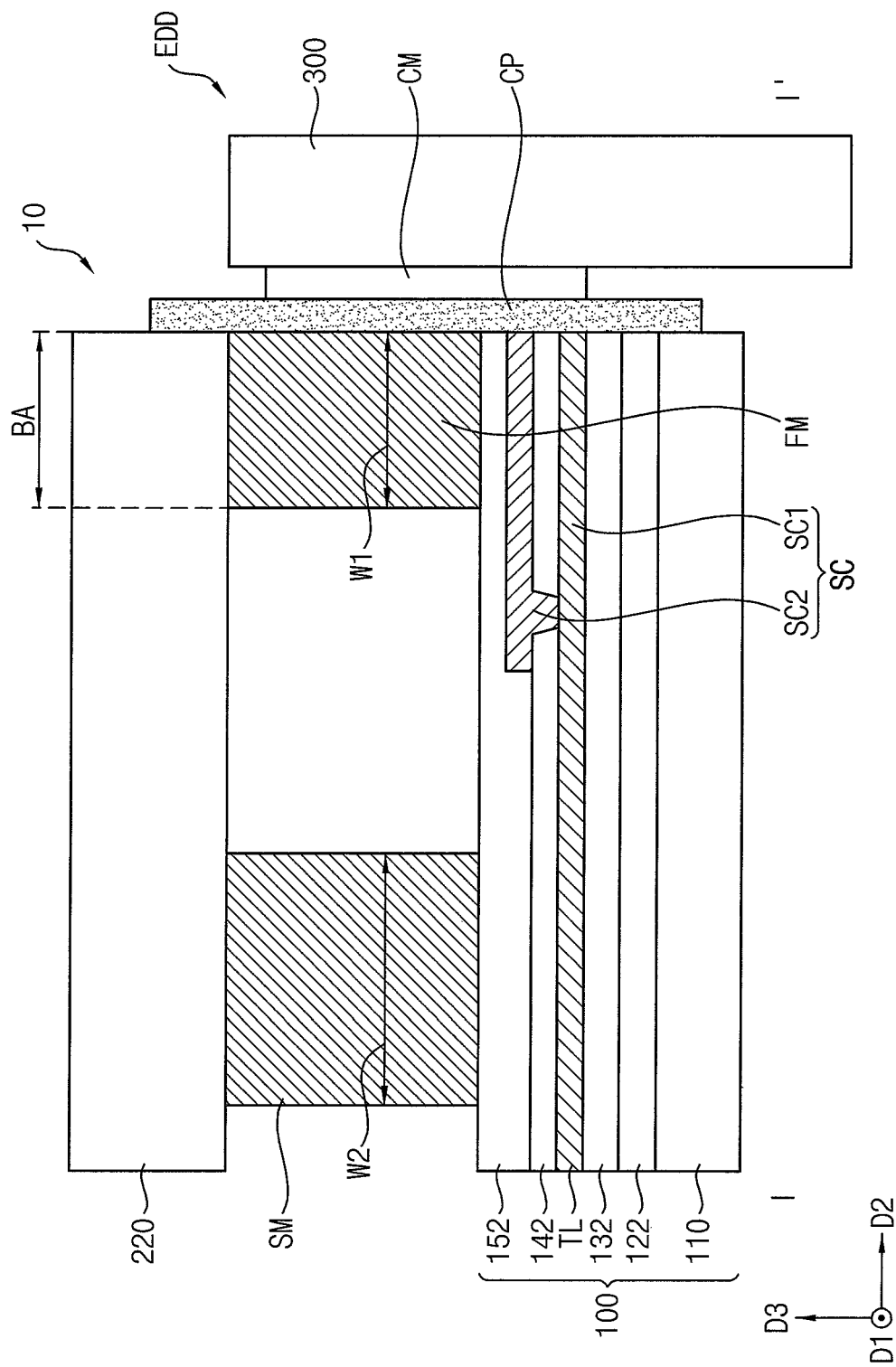

Referring to FIG. 14, the width W1 of a filling member FM may be less than the width W2 of a sealing member SM. For example, the width W1 of the filling member FM may be about 100 µm to about 300 µm, and the width of the sealing member SM may be about 300 µm to about 1,000 µm. When the width of the filling member FM is excessively small, the filling member FM may be damaged in the process of grinding the display panel so that the sealing member SM may be exposed.

Figure 15:
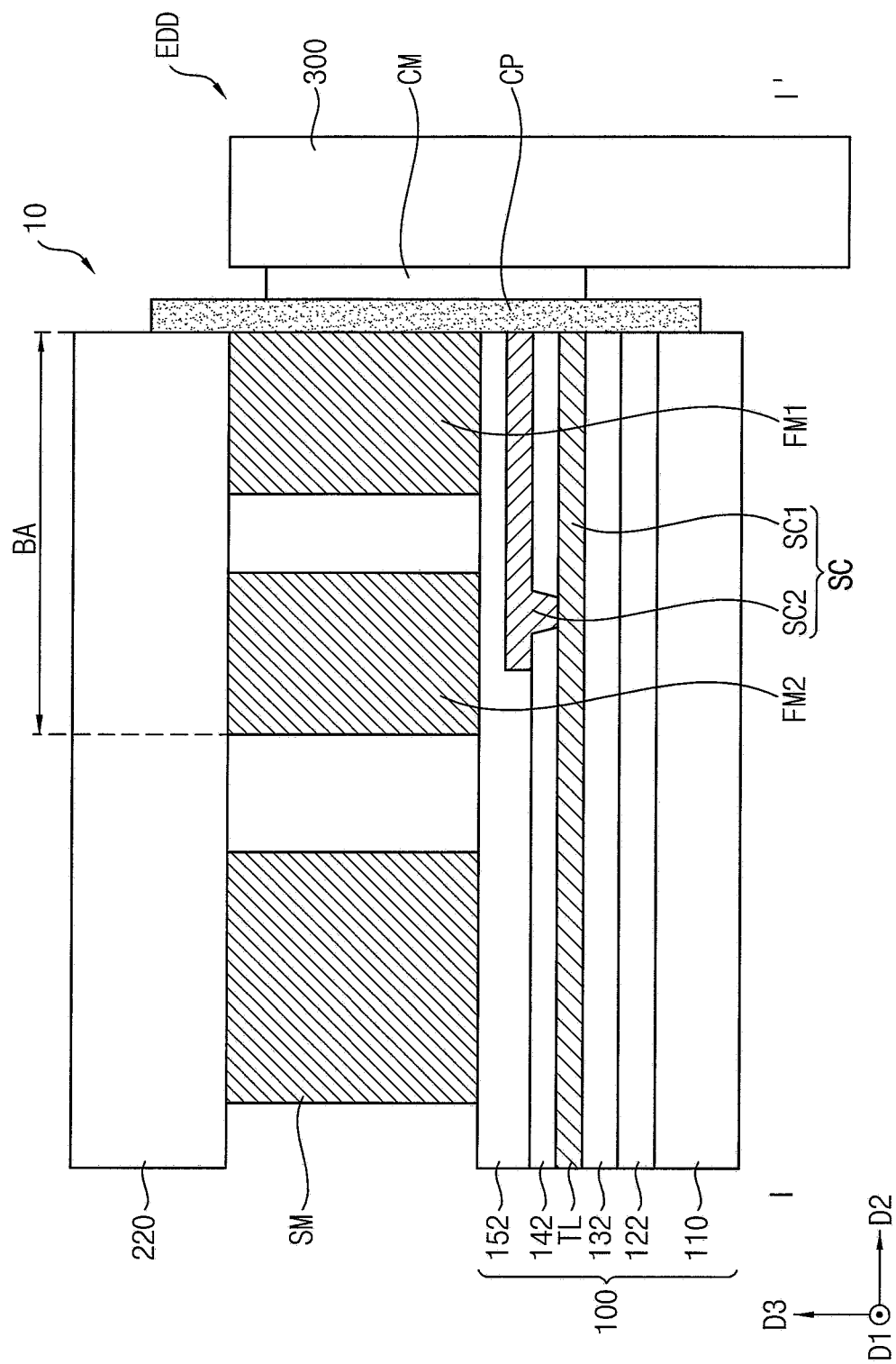

Referring to FIG. 15, the display device 10 includes a first filling member FM1 and a second filling member FM2. The second filling member FM2 may be disposed between the first filling member FM1 and a sealing member SM. The second filling member FM2 may be spaced apart from the first filling member FM1 and the sealing member SM.

In an exemplary embodiment, the display device 10 includes a plurality of the filling members. Thus, even if the first filling member is damaged, the second filling member may prevent infiltration of impurities and damage to the sealing member.

The above exemplary embodiments provide an organic-light emitting display device. However, exemplary embodiments are not limited thereto. For example, exemplary embodiments may be applied for a bonding structure of display devices such as a liquid crystal display device, an electroluminescent display device, a micro LED display device or the like.

Exemplary embodiments may be applied to various display devices. For example, exemplary embodiment may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
an array substrate including a pixel array disposed on a base substrate, a side terminal disposed on the base substrate, a transfer wiring electrically connected to the side terminal and the pixel array, and an inorganic insulation layer covering the side terminal;
a cover substrate coupled with the array substrate;
a seal disposed between the array substrate and the cover substrate and surrounding the pixel array;
a filler, spaced apart from the seal, the filler substantially consisting of an inorganic material overlapping at least a portion of the side terminal and filling a space between the array substrate and the cover substrate; and
a conductive connection pad disposed on a side surface of the array substrate and contacting the side terminal,
wherein the filler comprises a first filling member and a second filling member disposed between the first filling member and the seal, wherein the first filling member is separately disposed from the second filling member with a first air gap provided therebetween, wherein the first filling member and the second filling member are disposed along only a side of the array substrate where the side terminal is disposed,
wherein the first filling member has an outer side surface continuously connected to an outer side surface of the inorganic insulation layer and contacting the conductive connection pad, wherein the side terminal includes an upper conductive layer and a lower conductive layer disposed under the upper conductive layer with an intervening layer between the upper conductive layer and the lower conductive layer, and wherein both of the upper conductive layer and the lower conductive layer contact the conductive connection pad.

2. The display device of claim 1, wherein the filler consists of glass second filling member is separately disposed from the seal by a second air gap that is less than a width of the first air gap that separates the second filling member and the first filling member.

3. The display device of claim 1, wherein the filler comprises substantially the same material as the seal.

4. The display device of claim 1, wherein the filler comprises a filling member having a first width, and the seal comprises a sealing member having a second width larger than the first width.

5. The display device of claim 4, wherein the first width is from about 100 µm to about 300 µm, and the second width is from about 300 µm to about 1,000 µm.

6. The display device of claim 1, wherein the seal comprises a different material from that of the filler.

7. The display device of claim 1, wherein the side terminal comprises a plurality of conductive layers.

8. The display device of claim 1, wherein the transfer wiring is spaced apart from the conductive connection pad.

9. The display device of claim 1, further comprising a driving device bonded to the conductive connection pad, the driving device configured to generate a driving signal or a power to the transfer wiring through the conductive connection pad and the side terminal.

10. The display device of claim 9, wherein the driving device comprises a flexible printed circuit board on which a driving chip is mounted.

11. A method of manufacturing a display device, the method comprising the steps of:
preparing an array substrate including a pixel array disposed on a base substrate, a transfer wiring electrically connected to the pixel array, a conductive pattern electrically connected to the transfer wiring, and an inorganic insulation layer covering the conductive pattern;
forming a seal and a filler, the seal disposed between the array substrate and a cover substrate, the filler, being spaced apart from the seal, the filer substantially consisting of an inorganic material overlapping at least a portion of the conductive pattern, and filling a space between the array substrate and the cover substrate;
removing a portion of the array substrate to dispose a side terminal from the conductive pattern and/or, the side terminal being exposed through a side surface of the array substrate; and
forming a conductive connection pad on the side surface of the array substrate, the conductive connection pad contacting the side terminal,
wherein the filler comprises a first filler and a second filler spaced apart from the seal and the first filler with an air gap provided between the first filler and the second filler, wherein the first filling member and the second filling member are disposed along only a side of the array substrate where the side terminal is disposed,
wherein the second filler fills a second space between the array substrate and the cover substrate,
wherein the first filler has an outer side surface continuously connected to an outer side surface of the inorganic insulation layer and contacting the conductive connection pad,
wherein the conductive pattern includes an upper conductive layer and a lower conductive layer disposed under the upper conductive layer with an intervening layer between the upper conductive layer and the lower conductive layer, and
wherein both of the upper conductive layer and the lower conductive layer contact the conductive connection pad.

12. The method of claim 11, wherein the step of forming the seal and the filler comprises:
forming a sealing frit and a filling frit on a surface of the array substrate or the cover substrate;
disposing the array substrate to contact the cover substrate; and
sintering the sealing frit and the filling frit.

13. The method of claim 12, wherein the sealing frit and the filling frit comprise glass frit.

14. The method of claim 11, wherein the filler comprises a filling member, and the seal comprises a sealing member, and the step of removing the portion of the array substrate comprises:
scribing the cover substrate, the array substrate and the first filling member; and
grinding or polishing an exposed side surface of the cover substrate, the array substrate and the filling member.

15. The method of claim 11, wherein the step of forming the conductive connection pad comprises:
forming a metal layer contacting a side surface of the side terminal; and
patterning the metal layer.

* * * * *